US007363570B2

(12) United States Patent
Kim et al.

(10) Patent No.: US 7,363,570 B2
(45) Date of Patent: *Apr. 22, 2008

(54) METHOD OF CONVERTING PARITY CHECK MATRIX FOR LOW DENSITY PARITY CHECK CODING

(75) Inventors: Hyun-jung Kim, Suwon-si (KR); Ki-hyun Kim, Seongnam-si (KR); Yoon-woo Lee, Suwon-si (KR)

(73) Assignee: Samsung Eletronics Co., Ltd., Suwon (KR)

( * ) Notice: Subject to any disclaimer, the term of this patent is extended or adjusted under 35 U.S.C. 154(b) by 378 days.

This patent is subject to a terminal disclaimer.

(21) Appl. No.: 11/020,017

(22) Filed: Dec. 23, 2004

(65) Prior Publication Data
US 2005/0235191 A1    Oct. 20, 2005

(30) Foreign Application Priority Data
Apr. 19, 2004   (KR) .................... 10-2004-0026656

(51) Int. Cl.
H03M 10/00    (2006.01)
(52) U.S. Cl. ..................... 714/752; 714/800
(58) Field of Classification Search ............... 714/752, 714/800
See application file for complete search history.

(56) References Cited

U.S. PATENT DOCUMENTS 6,829,308 B2 * 12/2004 Eroz et al. ................. 375/271

6,895,547 B2 * 5/2005 Eleftheriou et al. ........ 714/801
2004/0255222 A1 * 12/2004 Kim et al. .................. 714/752

OTHER PUBLICATIONS

Xiao-Yu Hu et al., "Regular and Irregular Progressive Edge-Growth Tanner Graphs", *Online!* 2003, pp. 1-64, retrieved from the Internet on Aug. 23, 2005: URL:citeseer.ist.psu,edu/hu03regular.html>.
David J.C. MacKay, "Good Error-Correcting Codes Based on Very Sparse Matrices", *IEEE Transactions On Information Theory*, IEEE Inc. New York, vol. 45, No. 2, Mar. 1999, pp. 399-431.
T.J. Richardson et al., "Efficient Encoding of Low-Desity Parity-Check Codes", *IEEE Transactions On Information Theory*, IEEE Inc., New York, vol. 47, No. 2, Feb. 2001, pp. 638-656.
Richardson, Thomas J. "Efficient Encoding of Low-Density Parity-Check Codes," IEEE Transactions on Information Theory, vol. 47, No. 2, Feb. 2001, pp. 638-656.
David J. C. MacKay, "Good Error-Correcting Codes Based on Very Sparse Matrices", *IEEE Transactions on Information Theory*, vol. 45, No. 2, Mar. 1999, pp. 399-431.

* cited by examiner

*Primary Examiner*—Guy J. Lamarre
(74) *Attorney, Agent, or Firm*—Stein, McEwen & Bui, LLP

(57) ABSTRACT

A method of converting a parity check matrix for low density parity check coding comprising moving rows and columns of the parity check matrix such that the parity check matrix includes a lower triangular submatrix. A calculation load for creating parity information can be reduced by using the converted parity check matrix including the lower triangular submatrix.

8 Claims, 10 Drawing Sheets

FIG. 2A (PRIOR ART)

| 1 | 1 | 1 | 1 | 0 | 0 | 0 | 0 | 0 | 0 | 0 | 0 | 0 |
|---|---|---|---|---|---|---|---|---|---|---|---|---|
|   |   |   |   |   |   |   |   |   |   |   |   |   |

FIG. 2B (PRIOR ART)

| 1 | 1 | 1 | 1 | | | | | | | | | |
|---|---|---|---|---|---|---|---|---|---|---|---|---|
|   |   |   |   |   |   |   |   |   |   |   |   | A1 |

FIG. 2C (PRIOR ART)

| 1 | 1 | 1 | 1 |   |   |   |   |   |   |   |   |   |     |
|---|---|---|---|---|---|---|---|---|---|---|---|---|-----|
|   |   |   |   |   |   |   |   |   |   |   |   |   |     |
| 1 | 0 | 0 | 1 | 0 | 0 | 0 | 1 | 0 | 0 | 0 | 0 | 0 | —R1 |
|   |   |   |   |   |   |   |   |   |   |   |   |   |     |
| 1 | 0 | 0 | 0 | 0 | 0 | 0 | 0 | 0 | 0 | 0 | 1 | 0 | —R2 |
|   |   |   |   |   |   |   |   |   |   |   |   |   |     |

FIG. 2D (PRIOR ART)

| 1 | 1 | 1 | 1 | | | | | | | | | | |
|---|---|---|---|---|---|---|---|---|---|---|---|---|---|
| 1 | 0 | 0 | 1 | 1 | 0 | 0 | 0 | 0 | 0 | 0 | 0 | 0 | ←R1 |
| 1 | 0 | 0 | 0 | 0 | 1 | 0 | 0 | 0 | 0 | 0 | 0 | 0 | ←R2 |

I1 circled around the "1 0 / 0 1" region.

FIG. 2E (PRIOR ART)

| 1 | 1 | 1 | 1 | | |
|---|---|---|---|---|---|
| 1 | 0 | 0 | 1 | 1 | 0 |
| 1 | 0 | 0 | 0 | 0 | 1 |

A2 — hatched region

FIG. 2F (PRIOR ART)

| 1 | 1 | 1 | 1 | | | | |
|---|---|---|---|---|---|---|---|
| | | | | | | | |
| | | | | | | | |
| | | | | 1 | 1 | 1 | ←Rmin |

Cmin1  Cmin2  Cmin3

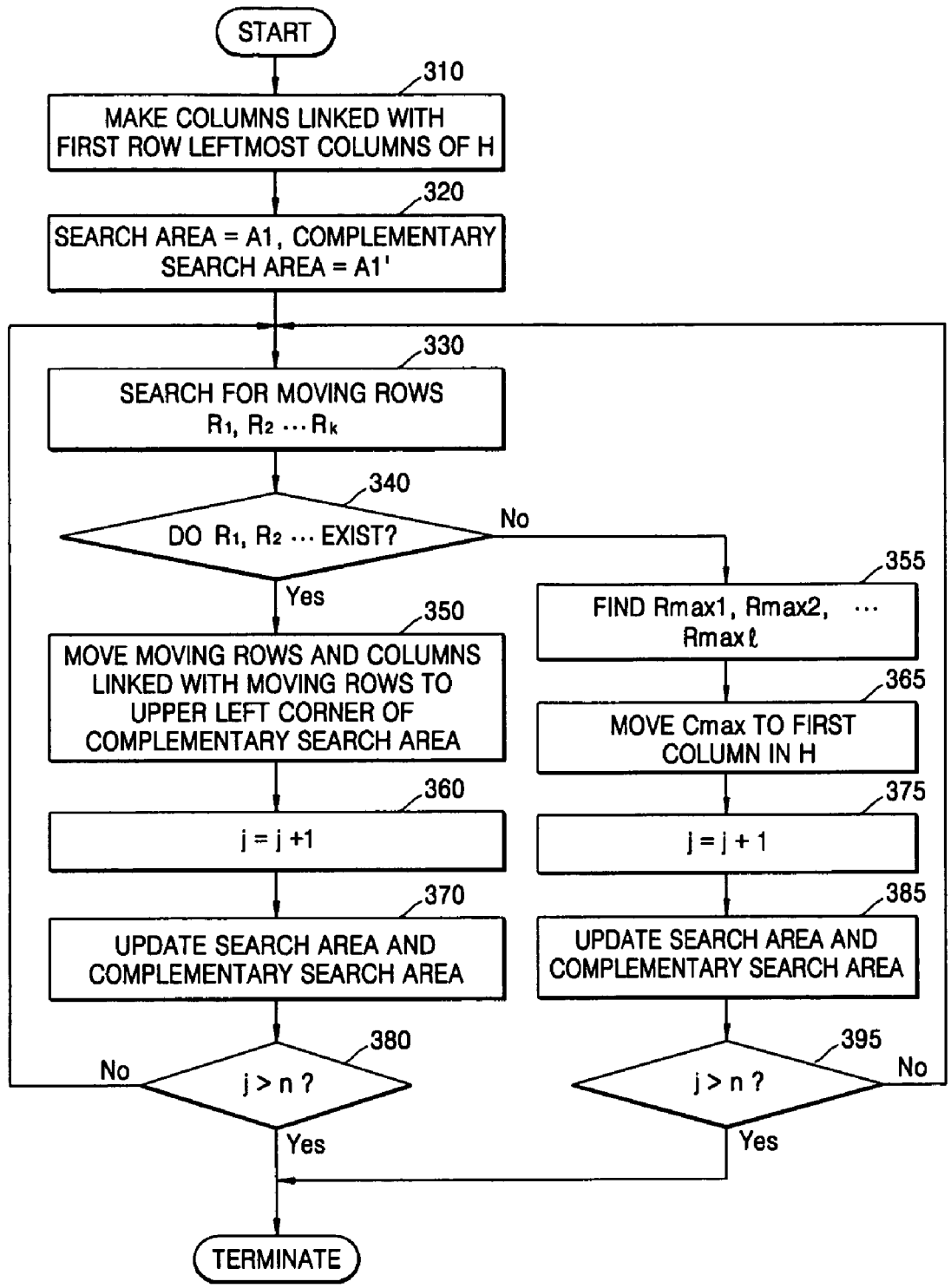

FIG. 4D

| 1 | 1 | 1 | 1 |   |   |   |
|---|---|---|---|---|---|---|
| 1 | 1 | 0 | 0 | 1 |   | — R1 |

FIG. 4E

| 1 | 1 | 1 |   |   |
|---|---|---|---|---|

METHOD OF CONVERTING PARITY CHECK MATRIX FOR LOW DENSITY PARITY CHECK CODING

CROSS-REFERENCE TO RELATED APPLICATION

This application claims the priority of Korean Patent Application No. 2004-26656, filed on Apr. 19, 2004 in the Korean Intellectual Property Office, the disclosure of which is incorporated herein in its entirety by reference.

BACKGROUND OF THE INVENTION

1. Field of the Invention

The present invention relates to a method of creating parity information for error correction, and more particularly, to a method of converting a parity check matrix for low density parity check coding.

2. Description of the Related Art

A low density parity check (LDPC) coding method has been widely used for creating information for error correction. The LDPC coding method is used to obtain parity information by using a low density parity check matrix H containing only 0's and 1's in which the number of 1's is far smaller than the number of 0's. The LDPC code is regular if each row and each column of the parity check matrix H contains the same number of 1's, and irregular otherwise. The numbers of 1's included in each row and each column of the parity check matrix H is called the "row degree" and the "column degree," respectively.

A method of creating parity information by using the LDPC coding method is usually accomplished based on the following equation:

$$HX=0, \qquad \text{Equation 1}$$

where, H is an m×n parity check matrix;
X is a code word matrix including m message data and p parity data; and
m+p=n (where m, n, and p are integers).

The basic concept of the LDPC coding is disclosed in D. J. MacKay, "Good Error-correction Codes Based on Very Sparse Matrices," IEEE Trans. on Information Theory, Vol. 45, No. 2, pp. 399-431. According to this disclosure, the parity information can be created by solving the above Equation 1 by using matrix manipulation using a Gaussian elimination method. However, such matrix manipulation requires a large number of calculations.

Recently, a more convenient method of solving the above Equation 1 has been introduced. According to this method, the parity check matrix H is converted into a rearranged parity check matrix H' which includes a specific type of sub-block, called a lower triangular matrix. The converted parity check matrix H' is used to create the parity information in a sequential manner. This method is disclosed in T. Richardson, R. Urbanke, "Efficient Encoding of Low Density Parity Check Codes," IEEE Trans. on Information Theory, Vol. 47, No. 2, pp. 638-656, 2001.

A conventional method of converting a parity check matrix H will now be described with reference to FIG. 1 and FIGS. 2A through 2F.

FIG. 1 is a flow chart illustrating a conventional method of converting the parity check matrix H into the rearranged parity check matrix H', and FIGS. 2A through 2F illustrate matrices resulting from each operation shown in FIG. 1. This conventional method is called the "greedy algorithm."

In operation 110, all the columns linked with a first row in the matrix H are made the leftmost columns of the matrix H. Herein, "a column linked with a specific row" is a column having 1's in the specific row, and the linked columns can be moved by i) exchanging or ii) shifting rows or columns. FIG. 2A shows a matrix after performing operation 110, in which the first row includes four 1's.

In operation 120, a current search area is defined as a matrix A1 in FIG. 2B not including the first row and the columns linked with the first row in the matrix H. The search area A1 functions as a reference area for determining the number of 1's in a row search or a column search which is accomplished in the following manner.

In operation 130, rows R1, R2, . . . , Rk having row degrees of one are found in the matrix A1. In FIG. 2C, the reference numerals, R1, R2, . . . , Rk, represent the rows having one "1" (i.e., a row degree of one) in the search area A1.

In operation 140, it is determined whether a row having a degree of one has been found as a result of the search. If a row having a degree of one is found, operations 150, 160, 170 and 180 are carried out.

In operation 150, the rows R1, R2, . . . , Rk and the columns C1, C2 . . . , Cm, linked with the rows R1, R2, . . . , Rk are sequentially moved to the upper left side of the matrix A1 through row movement and column movement, respectively. For example, if rows R1 and R2 have degrees of one, the column C1 linked with the row R1 is made the leftmost column of the matrix A1, and the row R1 is made the uppermost row of the matrix A1. Then, the column C2 linked with the row R2 is made the second leftmost column in the matrix A1, and the row R2 is made the second uppermost row in the matrix A1. As a result, a unit matrix I1 is created in the upper left side of the matrix A1 as shown in FIG. 2D.

In operation 160, a current index, i, representing an index of a first column in the current search area is incremented by the number of rows, k, found in operation 130. For example, in FIG. 2D, the current index, i, is 5, and the number of rows, k, is 2.

In operation 170, the current search area is updated to be a matrix A2 not including the unit matrix I1 in the search area A1 as shown in FIG. 2E.

In operation 180, it is determined whether the current index i is larger than the number of rows, n, of the parity check matrix H. If the current index i is smaller than the number of rows, n, then operation 130 is performed again. Otherwise, the matrix conversion procedure is terminated.

If a row having a degree of one is not found in operation 140, operations 155, 165, 175 and 185 are carried out.

In operation 155, a row Rmin having a lowest degree is searched for in the matrix A1.

In operation 165, columns Cmin1, Cmin2, . . . , CminI (I is an integer) linked with the row Rmin are found, and all but one of the columns Cmin1, Cmin2 . . . , CminI are made the leftmost columns of the matrix H as shown in FIG. 2F.

In operation 175, the current index, i, representing an index of a first column in the current search area is incremented by I−1. For example, in FIG. 2F, the current index, i, is 5, and the number of rows, k, is 3.

In operation 185, the search area is updated to be a matrix A2 excluding the columns moved in operation 165, as shown in FIG. 2G.

In operation 195, it is determined whether the current index, i, is larger than the number of rows, n, of the parity check matrix H. If the current index, i, is smaller than the number of rows, n, then operation 130 is performed again. Otherwise, the matrix conversion procedure is terminated.

FIG. 2H illustrates a converted matrix H' produced according to the conventional method. The converted matrix H' shown in FIG. 2H includes an identity matrix composed of unit matrices chained in a diagonal direction. A parity information calculation is carried out by using the right upper block D, which is the block filled only with 0's.

As a necessary condition for sequentially calculating the parity information, the converted matrix H' should contain a submatrix having a diagonal line of 1's, and the submatrix should be a lower triangular matrix. The converted matrix H' in FIG. 2H satisfies this condition.

The load for calculating parity information in the matrix H decreases as the size of the submatrix I increases. In other words, according to the conventional method, as the size of the submatrix increases, the calculation load for creating parity information decreases.

However, since the submatrix I of FIG. 2H must be an identity matrix, the size of the submatrix I can only increase to a limited degree. In other words, according to the conventional art, since the submatrix for sequential parity calculation is an identity matrix, the size of the submatrix I can only be increased to a limited amount. The more limited the size of matrix 1, the amount of calculation for decoding using the parity check matrix H increases. However, it is desired that the submatrix I of the converted matrix H' be a lower triangular matrix instead of an identity matrix, such that the size of the submatrix I can be larger than that shown in FIG. 2H.

SUMMARY OF THE INVENTION

The present invention provides a method of producing a converted matrix having a lower triangular submatrix with an increased size by not constructing a submatrix in the form of an identity matrix.

According to an aspect of the present invention, there is provided a method of converting a parity check matrix for low density parity check coding including moving rows and columns of the parity check matrix such that the parity check matrix includes a lower triangular submatrix.

In an aspect of the present invention, the method includes: moving columns linked with a first row in the parity check matrix to a left side of the parity check matrix; defining a submatrix including the columns linked with the first row and excluding the first row as a current search area, and a submatrix to the right of the current search area as a current complementary search area; selecting rows in which the number of 1's included in the current search area is equal to (row degree −1); and moving an element positioned at an intersection of one of the selected rows and a column linked with the one of the selected rows, to an upper left corner of the current complementary search area through row movement and/or column movement of the one of the selected rows and the column linked with the one of the selected rows if a row is selected.

In an aspect of the present invention, the moving of the element includes making the column linked with one of the selected rows a leftmost column of the current complementary search area through the column movement and making the one of the selected rows an uppermost row in the complementary search area through the row movement.

In an aspect of the present invention, the method includes moving at least one column of the current complementary search area to a left side of the parity check matrix if there is no row selected; and updating the current search area to include the columns which have been moved to the left side of the parity check matrix, and updating the current complementary search area by defining an area positioned in the right of the updated current search area as the current complementary search area.

In an aspect of the present invention, the moving of the at least one column of the current complementary search area includes: selecting a conditional row containing a smallest number of 1's in the current complementary search area among the rows included in the current search area; and making one of the columns linked with the selected conditional row a leftmost column of the parity check matrix.

According to another aspect of the present invention, there is provided a method of creating parity information by using a parity check matrix in low density parity check coding, wherein the parity check matrix includes a sub-block of which elements of a diagonal line are filled with "1", an upper block with respect to the diagonal line are filled with "0", and a lower block with respect to the diagonal line contains "0" or "1", and wherein the sub-block is produced through row movement and/or column movement of the parity check matrix.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 2A through 2H illustrate matrices resulting from operation shown in FIG. 1;

FIG. 3 is a flow chart illustrating a method of producing a converted matrix according to an embodiment of the present invention;

FIGS. 4A through 4I illustrate matrices resulting from the operations shown in FIG. 3; and FIGS. 5A and 5B illustrate the structures of parity check matrices according to the conventional art and according to an embodiment of the present invention, respectively.

DETAILED DESCRIPTION OF THE EMBODIMENTS

Figure 1:
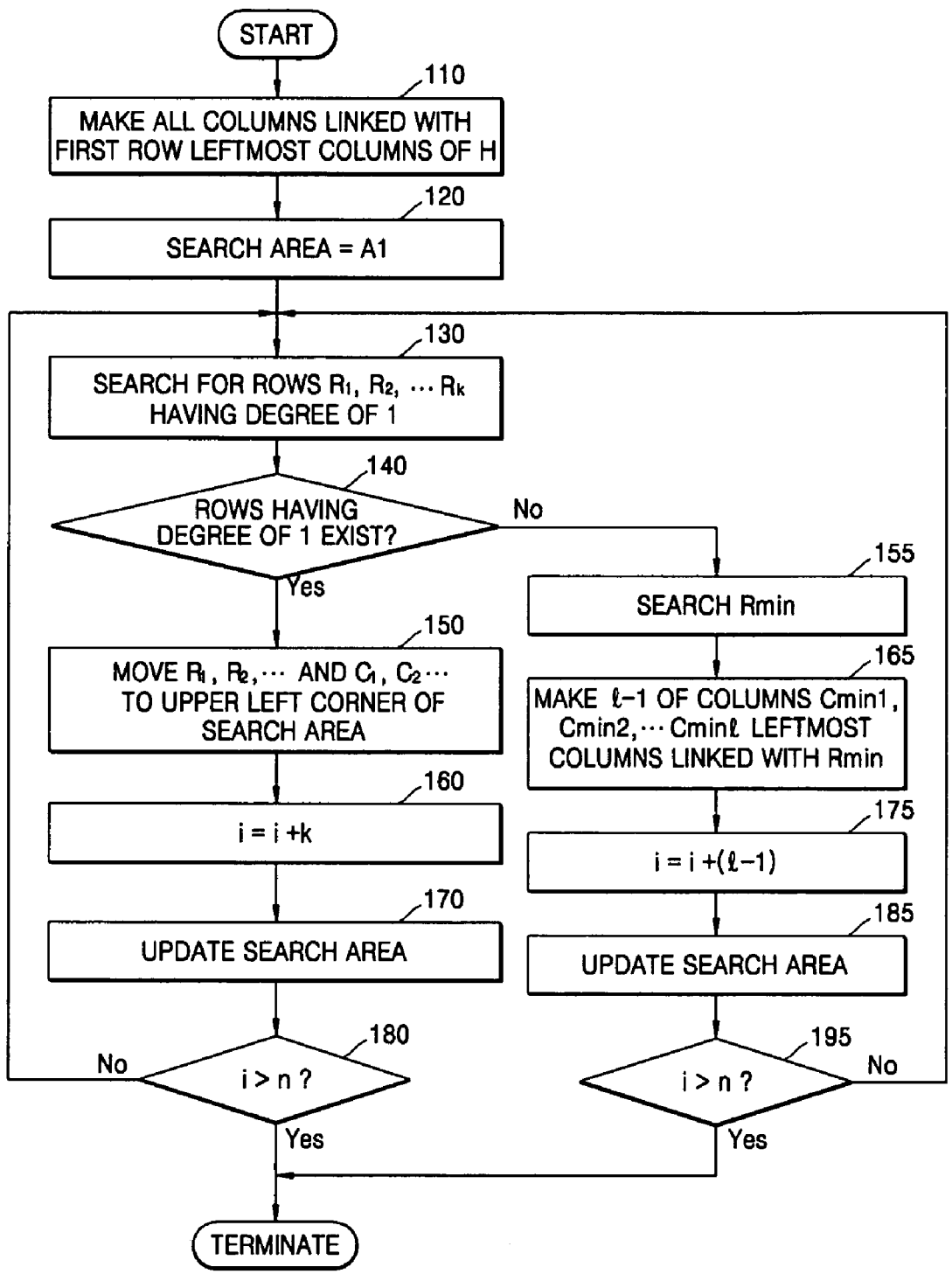
FIG. 1 is a flow chart illustrating a conventional method of converting a parity check matrix into a rearranged parity check matrix.
Figure 2G:
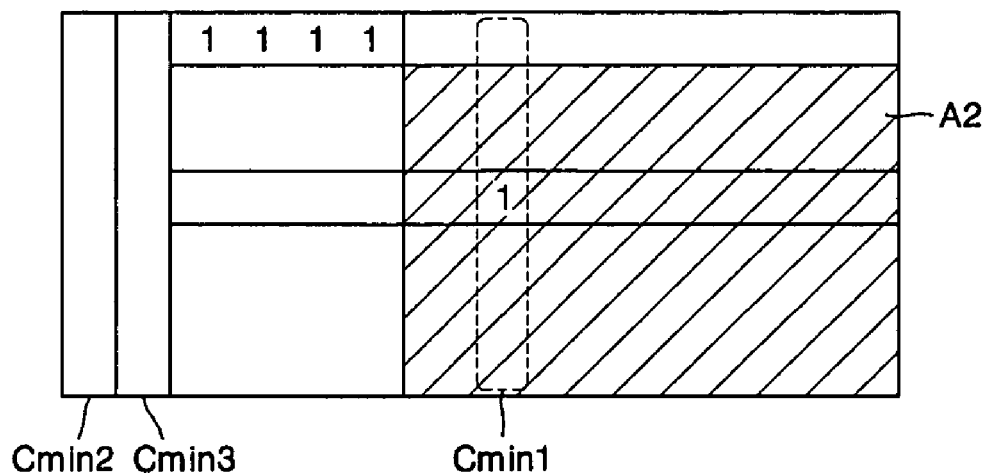
Figure 2H:
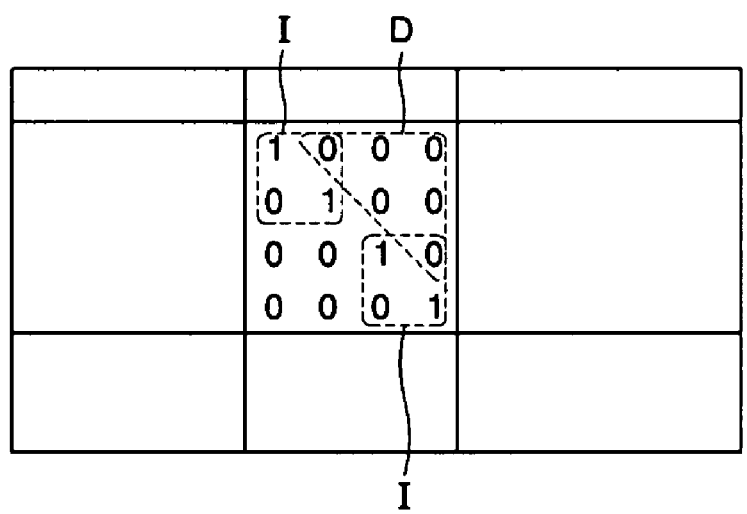

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 3 is a flow chart illustrating a method of creating a converted matrix according to an embodiment of the present invention, and FIGS. 4A through 4I show matrices resulting from operation shown in FIG. 3. Now, the method shown in FIG. 3 will be described with reference to FIGS. 4A through 4I.

In operation 310, all columns linked with the first row of the parity check matrix H are made the leftmost column of the parity check matrix H. Herein, "a column linked with a specific row" is a column having a 1 in the specific row, and the linked columns can be moved by i) exchanging or ii) shifting rows or columns.

For example, if columns, C2, C4, C7, and C15 are linked with the first row, they are moved to the leftmost side of the matrix H based on when they are detected, and then the remaining columns are shifted to the right. The order of the columns C2, C4, C7, and C15 is not important. A first submatrix SB1 in FIG. 4A contains 1's as a result of operation 310. A second submatrix SB2 contains only 0's because all the columns containing 1's must be made the left most columns of the matrix H.

Figure 4A:
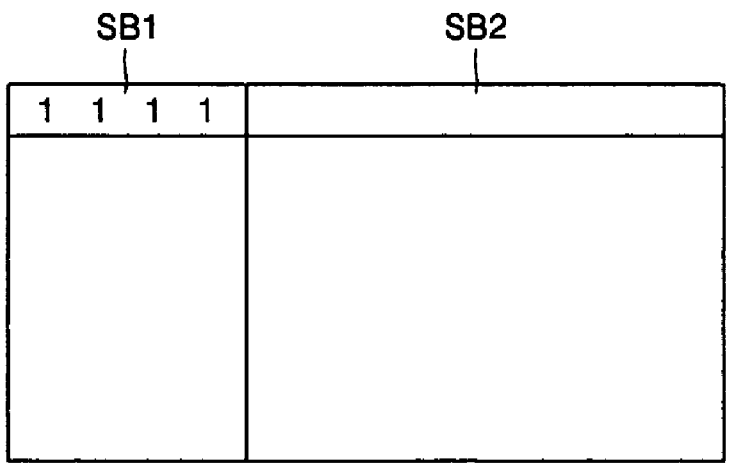
Figure 4B:
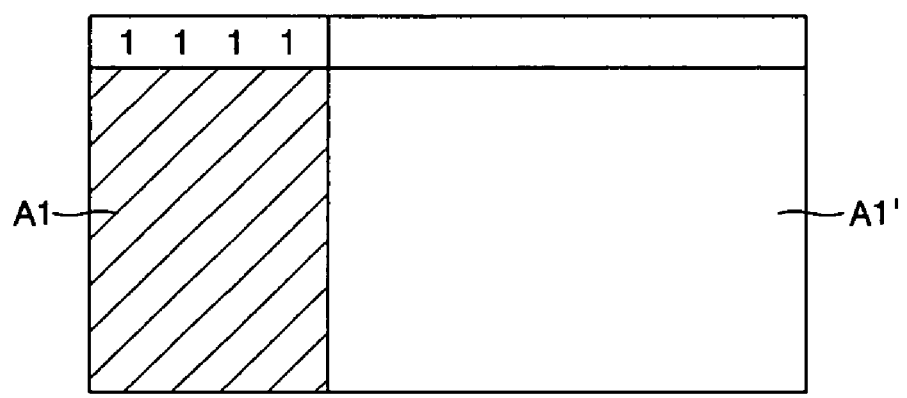
Figure 4C:
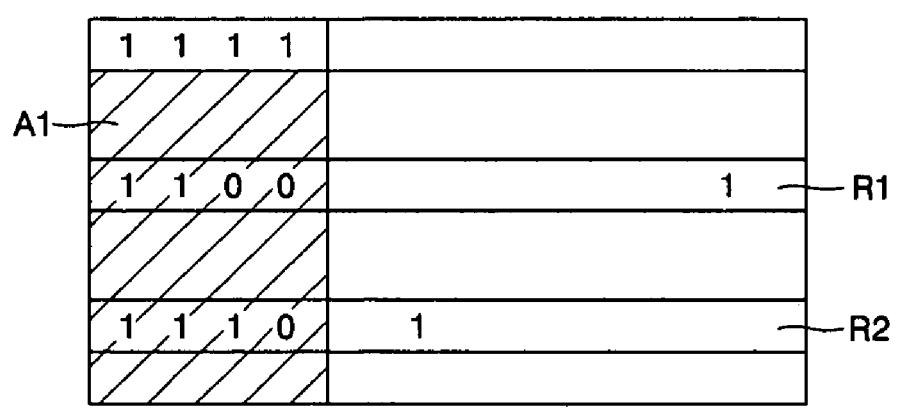

In operation 320, a submatrix A1 below the first submatrix SB1 in the matrix H is defined as a current search area A1. The search area functions as a basis of calculation of degrees of rows or columns in a row or column search. In addition, an area to the right of the current search area A1 in the matrix H is defined as a current complementary search area A1'. In FIG. 4B, the current search area submatrix A1 is shown as a block filled with slanted lines, and the current complementary search area A1' is a matrix to the right of the current search area submatrix A1.

In operation 330, rows R1, R2, . . . , Rk having a number of 1's in the submatrix A1 equal to (row degree −1) are formed in the submatrix A1. For example, in FIG. 4C, since the row R1 has a row degree of 3 and contains two 1's in the submatrix A1, the row R1 satisfies the above condition. In addition, since the row R2 has a row degree of 4 and contains three 1's in the submatrix A1, the row R2 also satisfies the above condition.

In operation 340, if at least one row satisfying the above condition is found as a result of operation 330, then operations 350, 360, 370 and 380 are carried out.

In operation 350, the row R1 is moved to the left upper side of the complementary matrix A1' by performing row movement and column movement.

First, the column C1 linked with the row R1 is made the leftmost column (i.e., a fifth column in the matrix H) of the current complementary search area A1'. The columns originally to the left of the column C1 are sequentially shifted to the right.

Then, the row R1 is made the uppermost row of the complementary search area A1'. The rows originally above the row R1 are sequentially shifted down.

Figures 4D, 4E:
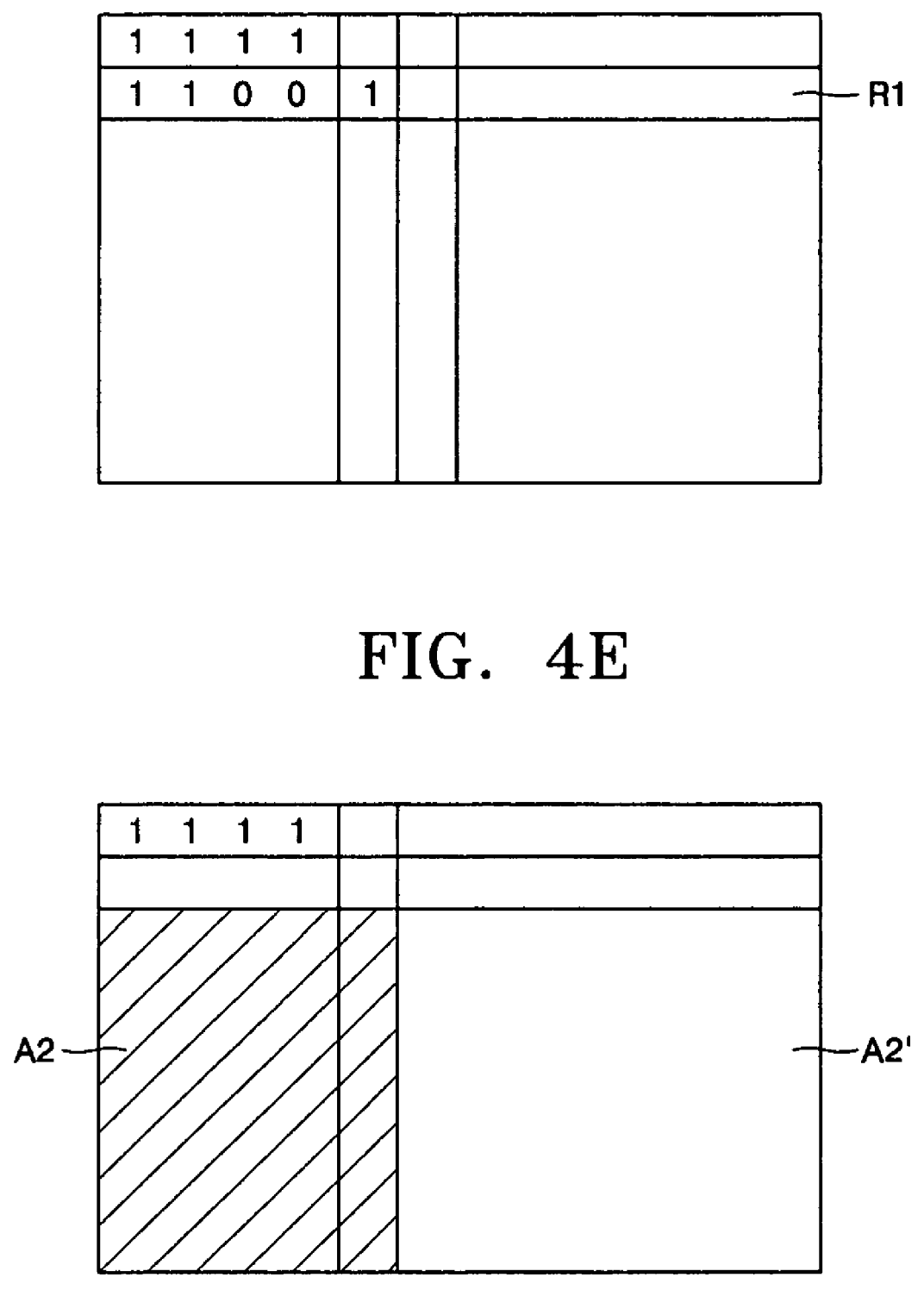

FIG. 4D shows a matrix resulting from operation 350.

In operation 360, a current index, j, representing an index of the first row in the current search area A1 is incremented by one.

In operation 370, the current search area A1 and the current complementary search area A1' are updated. In other words, the current search area A1 is updated to be a second current search area A2 by excluding the row moved as a result of operation 350 and including the column moved as a result of operation 350. In FIG. 4E, the area filled with slanted lines is the second current search area A2, and the area positioned to the right of the second current search area A2 is the second complementary search area A2'.

In operation 380, it is determined whether the current index, j, is larger than the number of columns, n, of the parity check matrix H. If the current index, j, is larger than the number of columns, n, the matrix conversion procedure is terminated. Otherwise, operation 330 is performed again.

In operation 340, if there is no row in which the number of 1's in the second current search area A2 is equal to (row degree −1), operations 355, 365, 375, 385 and 395 are carried out. Operation 355 through 395 generate the rows in which the number of 1's in the second current search area A2 is equal to (row degree −1) through column movement if such a row is not found as a result of operation 330.

In operation 355, conditional rows, for example, Rmax1, Rmax2, . . . , RmaxI, containing a smallest number of 1's in the second complementary search area A2' are found by searching the rows in the second current search area A2. Herein, I is the number of the conditional rows.

Figure 4F:
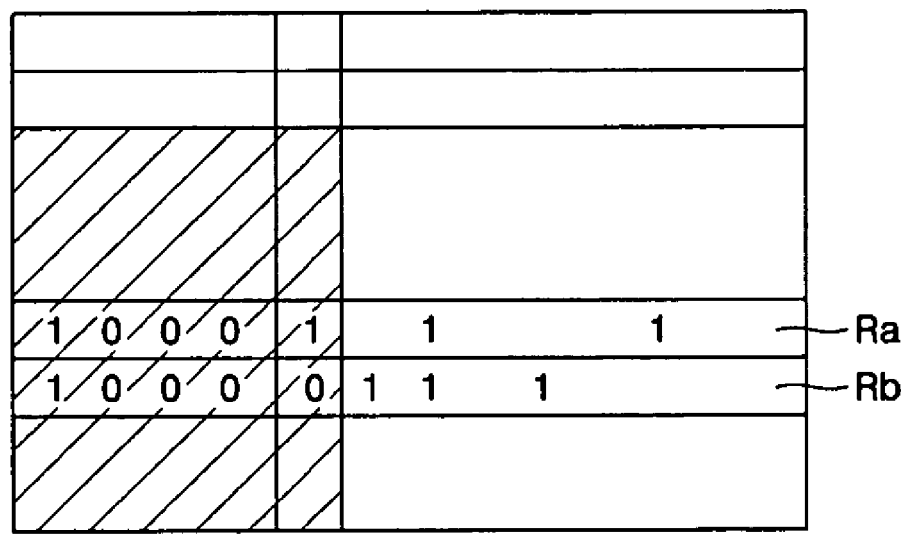

In FIG. 4F, a row Ra corresponds to the row containing the smallest number of 1's in the second complementary search area A2'.

Figure 4G:
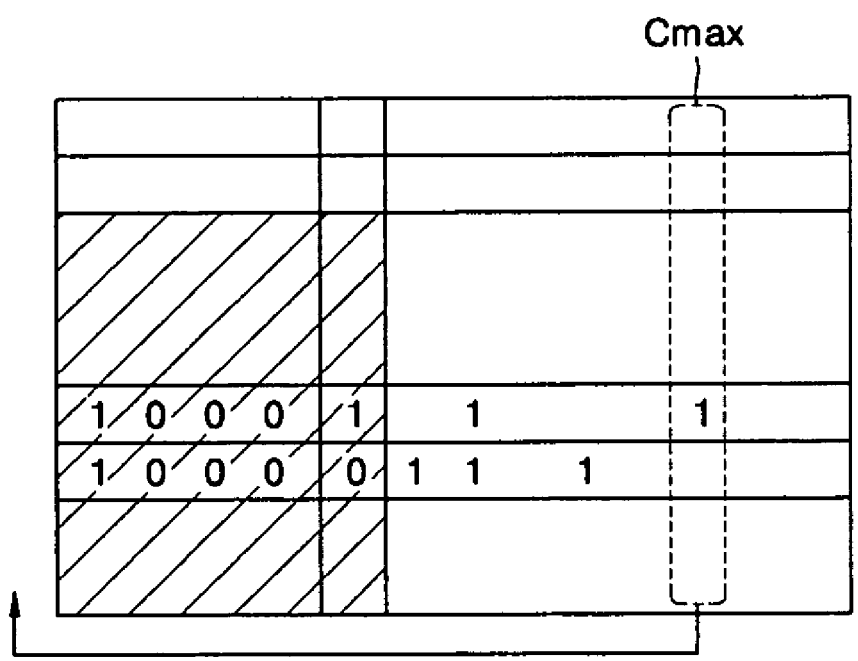
Figure 4H:
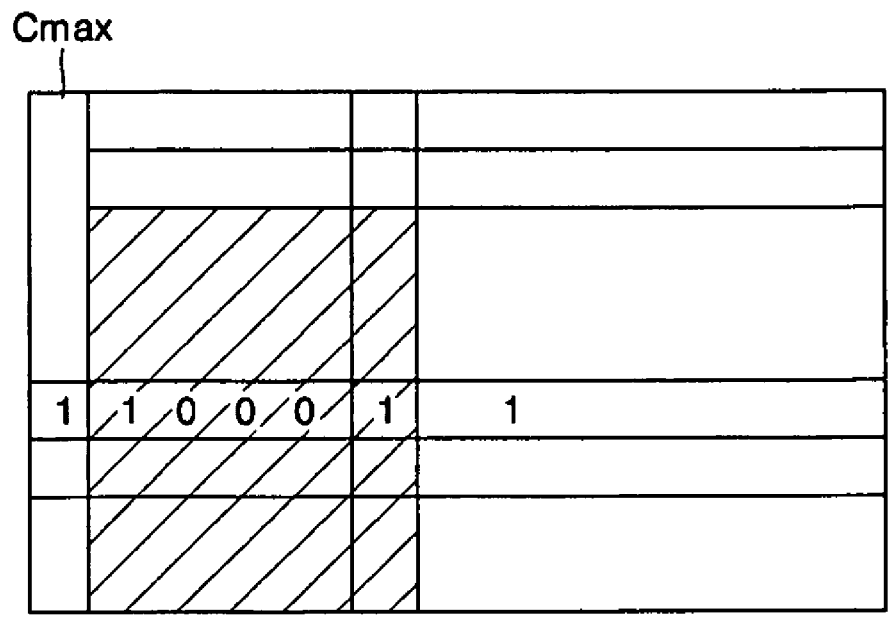

In operation 365, one of the conditional columns Cmax1, Cmax2, . . . , Cmaxm linked with the conditional row searched in operation 355 is moved to be the leftmost column of the parity check matrix H. FIG. 4G illustrates how the conditional column Cmax is made the leftmost column in the matrix H, and FIG. 4H illustrates the parity check matrix H after moving the conditional column Cmaxm.

In operation 375, the current index, j, representing the index of the first row in the second current search area A1 is incremented by one.

Figure 4I:
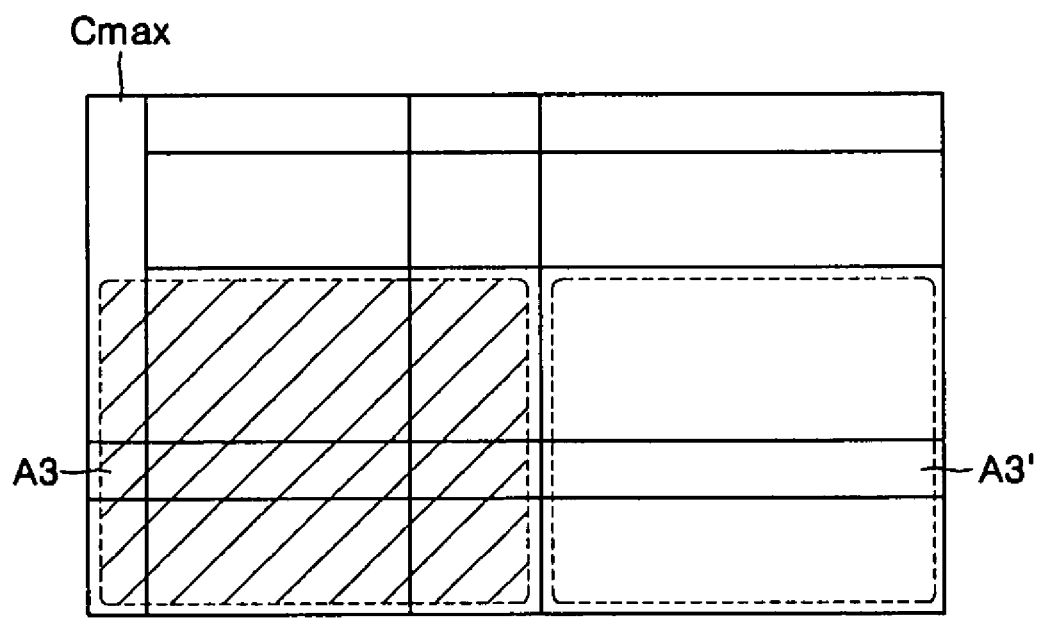

In operation 385, the second current search area A2 and the second complementary search area A2' are updated. In other words, the third current search area A3 is formed by adding the conditional column Cmax to the second current search area A2, and a third complementary search area A3' positioned to the right of the third current search area A3 is set as a third current complementary search area. FIG. 4I illustrates the parity check matrix H after the third current search area A3 and the third complementary search area A3' are formed.

In operation 395, it is determined whether the current index, j, is larger than the number of the columns, n, in the parity check matrix H. If the current index, j, is larger than the number of columns, n, the matrix conversion procedure is terminated. Otherwise, operation 330 is performed again.

Operations 355, 365, 375, 385 and 395 generate a row in which the number of 1's in the second current search area A2 is equal to (row degree −1) through column movement if such a row is not found as a result of operation 370. This is because, as a column containing a 1 in the row with the smallest degree is made the leftmost column in the parity check matrix H, the number of 1's included in the current search area increases. The increase of the number of 1's in the current search area promotes the generation of rows in which the number of 1's in the search area is equal to (row degree −1).

In the method described in FIG. 3, in operation 340 through 380, a lower triangular matrix is generated through row movement and column movement of a row in which the number of 1's in the search area is equal to (row degree −1) and the columns linked with the row. If no such row exists, operations 355, 365, 375, 385 and 395 are carried out to promote generation of such a row as described above.

Figures 5A, 5B:
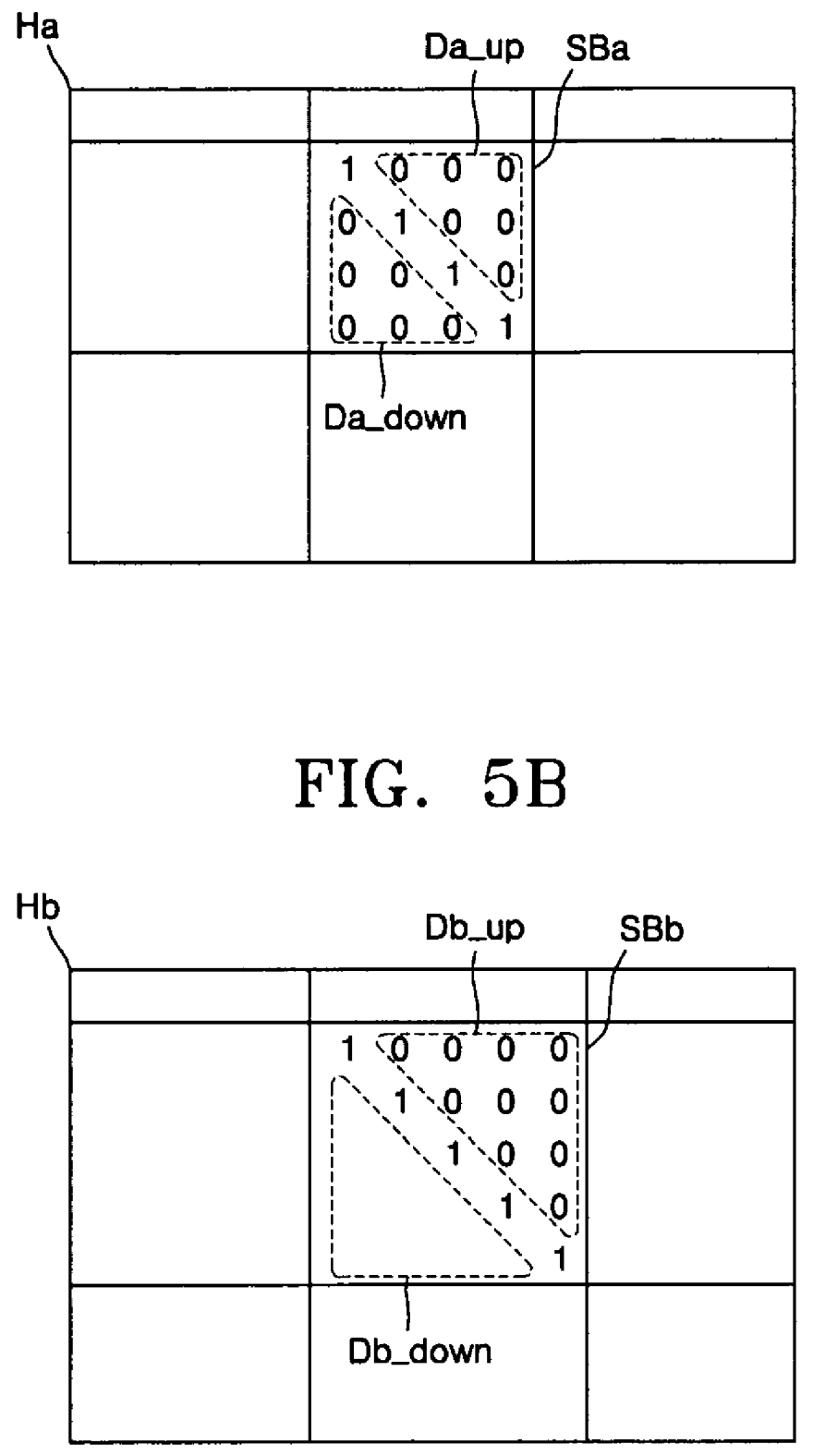

FIGS. 5A and 5B illustrate the structure of parity check matrices according to the conventional art and according to an embodiment of the present invention, respectively.

As a necessary condition for conveniently solving the Equation 1 in order to create parity information, the converted parity check matrix should include a submatrix in the form of a lower triangular matrix, of which i) a diagonal line is filled with only 1's and ii) the upper sub-block of the diagonal line is filled only with 0's.

Referring to FIG. 5A, the parity check matrix Ha produced according to the conventional art includes a submatrix SBa that satisfies the above conditions i) and ii). In particular, according to the conventional art, a lower submatrix Da_down and an upper submatrix Da_up of the submatrix contains only 0's.

Referring to FIG. 5B, the parity check matrix Hb produced according to an embodiment of the present invention includes a submatrix SBb satisfying the above conditions i) and ii), similarly to the submatrix SBa. However, unlike in the conventional art, a lower left sub-block Db_down can contain 0' and 1's.

As a result of the row movement and the column movement, the parity check matrix is converted into the matrices shown in FIGS. 5A and 5B according to the conventional art and according to an embodiment of the present invention, respectively. Therefore, when starting with the same parity check matrix, it is probable that the submatrix SBb produced according to an embodiment of the present invention is larger than the submatrix SBa produced according to the conventional art. This is because the submatrix SBa should be an identity matrix while the submatrix SBb should only be a lower triangular matrix Since a calculation load for solving Equation 1 is reduced as the size of the submatrix SBa or SBb increases, it is possible to reduce the calculation load for solving the above Equation 1 when using the method of producing a converted parity check matrix according to an embodiment of the present invention. The converted parity check matrix may be used in a communication system or any data recording and/or reproducing device to enable error correction on data to be performed using the converted parity check matrix.

The present invention can also be embodied as computer readable codes on a computer readable recording medium capable of execution by a computer. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. (Also, functional programs, codes, and code segments for accomplishing the present invention can be easily construed by programmers skilled in the art to which the present invention pertains.)

According to aspects of the present invention, it is possible to produce a parity check matrix capable of reducing a calculation load for creating parity information by moving rows and columns based on a method different form the conventional art.

While the present invention has been particularly shown and described with reference to exemplary embodiments thereof, it will be understood by those skilled in the art that various changes in form and details may be made therein without departing from the spirit and scope of the invention as defined by the appended claims and their equivalents. The exemplary embodiments should be considered in descriptive sense only, and are not for purposes of limitation. Therefore, the scope of the invention is defined not by the detailed description of the invention but by the appended claims and their equivalents, and all differences within the scope will be construed as being included in the present invention.

What is claimed is:

1. A computer readable recording medium storing a program for implementing a method of converting a parity check matrix for low density parity check coding, the method comprising moving rows and columns of the parity check matrix such that elements of a diagonal line are filled with "1", the elements of an upper block with respect to the diagonal line are filled with "0", and the elements of a lower block with respect to the diagonal line contains at least one "1,".

wherein the moving the rows and columns comprises:
moving columns linked with a first row in the parity check matrix to a left side of the parity check matrix;
defining a submatrix including the columns linked with the first row and excluding the first row as a current search area, and a submatrix to the right of the current search area as a current complementary search area;
selecting rows in which a number of 1's included in the current search area is equal to (row degree −1);
moving an element positioned at an intersection of one of the selected rows and a column linked with the one of the selected rows, to an upper left corner of the current complementary search area through row movement and/or column movement of the one of the selected rows and the column linked with the one of the selected rows if a row is selected;
updating the current search area to include the column moved during the moving of the element and to exclude the one of the selected rows, and updating the current complementary search area to be a submatrix positioned to the right of the updated current search area;
performing iteratively the selecting of the rows through the updating of the current search area and the current complementary search area; and
updating iteratively the current search area until a last row of the parity check matrix is reached.

2. The computer readable medium according to claim 1, wherein the moving of the element comprises:
making a first column linked with the one of the selected rows a leftmost column of the current complementary search area; and
making the one of the selected rows an uppermost row of the complementary search area.

3. The computer readable medium according to claim 1, wherein the method further comprises:
moving at least one column of the current complementary search area to the left side of the parity check matrix if there is no row selected; and
updating the current search area to include the at least one column which is moved to the left side of the parity check matrix, and updating the current complementary search area by defining an area positioned in the right of the updated current search area as the current complementary search area.

4. The computer readable medium according to claim 3, wherein the moving of the at least one column of the current complementary search area comprises:
selecting a conditional row containing a smallest number of 1's in the current complementary search area among the rows included in the current search area; and
making one of the columns of the current complementary search area linked with the selected conditional row a leftmost column of the parity check matrix.

5. The computer readable medium according to claim 3, wherein the method further comprises:
performing iteratively the selecting of the rows through the updating of the current search area and the current complementary search area; and
updating iteratively the current search area until a last row of the parity check matrix is reached.

6. A computer readable recording medium storing a program for implementing a method of creating parity information for use in error correction of data, the method comprising:

using a parity check matrix in low density parity check coding, wherein the parity check matrix includes a sub-block of which elements of a diagonal line are filled with "1", an upper block with respect to the diagonal line are filled with "0", and a lower block with respect to the diagonal line contains at least one "1"; and producing the sub-block through row movement and/or column movement of the parity check matrix, wherein the producing the sub-block through the row movement and/or the column movement comprises:

moving columns linked with a first row in the parity check matrix to a left side of the parity check matrix;

defining a submatrix including the columns linked with the first row and excluding the first row as a current search area, and a submatrix to the right of the current search area as a current complementary search area;

selecting rows in which a number of 1's included in the current search area is equal to (row degree −1);

moving an element positioned at an intersection of one of the selected rows and a column linked with the one of the selected rows, to an upper left corner of the current complementary search area through the row movement and/or the column movement of the one of the selected rows and the column linked with the one of the selected rows if a row is selected;

moving at least one column of the current complementary search area to a left side of the parity check matrix if there is no row selected; and updating the current search area to include the at least one column which is moved to the left side of the parity check matrix, and updating the current complementary search area by defining an area positioned in the right of the updated current search area as the current complementary search area.

7. A computer readable recording medium storing a program for implementing a method of generating a converted parity check matrix H for use with a recording and/or reproducing system to encode data according to a low density parity check coding method to perform error correction, the method comprising:

identifying linking columns with a first row of the parity check matrix;

moving the linked columns to form leftmost columns of the parity check matrix;

setting a first search area as remaining rows of the parity check matrix within the linked columns;

setting a second search area as the remaining rows of the parity check matrix within the unlinked columns;

identifying a degree row including a number of 1's in the first search area equal to one less than a row degree of the degree row from among the remaining rows;

shifting a degree column linked with the identified degree row in the second search area to form a leftmost column of the second search area, and shifting the identified degree row to form an uppermost row of the first and second search areas;

identifying a conditional row containing a smallest number of 1's in the second search area from among the remaining rows when the degree row is not identified;

shifting a maximum conditional column linked with the conditional row in the second search area to form a leftmost column of the parity check matrix;

updating the first search area as the remaining rows below the first row or the degree row within the linked columns and the degree column or the maximum conditional column; and updating the second search area as the remaining rows below the first row or the degree row within the unlinked columns, wherein the method is performed until a last row of the parity check matrix is reached.

8. The computer readable medium of claim 7, wherein a recording and/or reproducing apparatus uses the parity check matrix diagonal elements having a value of 1, and at least one element of a lower block of the parity check matrix with respect to the diagonal elements has a value of 1 after the last row is reached to perform error correction.

* * * * *

UNITED STATES PATENT AND TRADEMARK OFFICE
CERTIFICATE OF CORRECTION

| | | |
|---|---|---|
| PATENT NO. | : 7,363,570 B2 | Page 1 of 1 |
| APPLICATION NO. | : 11/020017 | |
| DATED | : April 22, 2008 | |
| INVENTOR(S) | : Hyun-jung Kim et al. | |

It is certified that error appears in the above-identified patent and that said Letters Patent is hereby corrected as shown below:

Column 8, line 7, delete ".".

Column 10, line 41, insert new claim 9 (original claim 3):

--9. The computer readable medium according to claim 1, wherein the method of moving of the element comprises making the column linked with the one of the selected rows a leftmost column of the current complementary search area through the column movement and making the one of the selected rows an uppermost row in the complementary search area through the row movement.--

Signed and Sealed this

Fifteenth Day of July, 2008

JON W. DUDAS
*Director of the United States Patent and Trademark Office*